US012615740B2

(12) United States Patent
Chen

(10) Patent No.: US 12,615,740 B2
(45) Date of Patent: Apr. 28, 2026

(54) LIQUID-COOLING HEAT DISSIPATION DEVICE

(71) Applicant: Chien-Hao Chen, Keelung City (TW)

(72) Inventor: Chien-Hao Chen, Keelung City (TW)

( * ) Notice: Subject to any disclaimer, the term of this patent is extended or adjusted under 35 U.S.C. 154(b) by 108 days.

(21) Appl. No.: 18/526,478

(22) Filed: Dec. 1, 2023

(65) Prior Publication Data

US 2025/0071939 A1    Feb. 27, 2025

(30) Foreign Application Priority Data

Aug. 24, 2023    (TW) ................................. 112131915

(51) Int. Cl.
*H05K 7/20*        (2006.01)
*G06F 1/20*        (2006.01)

(52) U.S. Cl.
CPC ..... *H05K 7/20272* (2013.01); *H05K 7/20254* (2013.01); *H05K 7/20263* (2013.01); *G06F 1/20* (2013.01)

(58) Field of Classification Search
CPC .. G06F 1/20; H05K 7/20254; H05K 7/20272; H05K 7/20263; H05K 7/20772
See application file for complete search history.

(56) References Cited

U.S. PATENT DOCUMENTS

| | | | | |
|---|---|---|---|---|
| 3,829,236 | A | * | 8/1974 | MacLennan .............. F01P 7/02 |
| | | | | 277/409 |
| 5,960,748 | A | * | 10/1999 | Lewis ..................... F01P 7/044 |
| | | | | 123/41.12 |
| 7,013,959 | B2 | * | 3/2006 | Lee ........................... F28F 3/12 |
| | | | | 174/15.1 |
| 7,312,995 | B2 | * | 12/2007 | Wilson ..................... G06F 1/20 |
| | | | | 165/80.4 |
| 10,477,731 | B1 | * | 11/2019 | Fu ....................... H05K 7/20818 |
| 2004/0042174 | A1 | * | 3/2004 | Tomioka ................. G06F 1/203 |
| | | | | 361/679.53 |
| 2017/0115708 | A1 | * | 4/2017 | Tivadar ..................... G06F 1/20 |
| 2019/0104641 | A1 | * | 4/2019 | Fan ........................... G06F 1/20 |
| 2021/0176893 | A1 | * | 6/2021 | Shieh ................. H05K 7/20172 |

FOREIGN PATENT DOCUMENTS

TW                 I703919  B   *   9/2020

* cited by examiner

*Primary Examiner* — Zachary Pape
(74) *Attorney, Agent, or Firm* — MUNCY, GEISSLER, OLDS & LOWE, P.C.

(57) ABSTRACT
A liquid-cooling heat dissipation device which comprises a cooling plate, a heat dissipator having a working liquid therein, and at least two conduits connecting the cold plate to the heat dissipator is described. A surface of the cooling plate is configured to contact a heat-generating component, thereby transferring the heat generated by the heat-generating component to the cooling plate and conducting the heat away to the heat dissipator via a working liquid.

7 Claims, 7 Drawing Sheets

LIQUID-COOLING HEAT DISSIPATION DEVICE

CROSS REFERENCE TO RELATED APPLICATIONS

This application claims priority of application Ser. No. 11/213,1915 filed in TW on Aug. 24, 2023 under 35 U.S.C. § 119, the entire contents of which are hereby incorporated by reference.

FIELD OF THE INVENTION

The present disclosure relates to a liquid-cooling heat dissipation device that is simple in structure, low in cost, and can reduce the impact of liquid-flow conduits on the internal layout and aesthetics of the computer chassis.

BACKGROUND OF THE INVENTION

In recent years, the development of computing devices has been changing very rapidly. With the evolution of the times, the application of computing devices can be seen everywhere, and it has become what is called a computer today. Computers have a variety of execution and calculation functions. Personal computers are used in family life with functions such as entertainment, word processing, and video playback. Industrial computers provide services such as control, supervision, and calculation for factory operations. Car computers provide drivers and passengers with multimedia entertainment and the function of receiving information in real time. Overall, computers have become indispensable devices for the human society.

Computer components may generate high heat during operation, which heat may be accumulated in the computer case. Therefore, in order to maintain the stability of the computer's operations in the current home desktop computer, heat dissipation devices, such as a fan, may be used, and the most common way is to assemble the fan to achieve the cooling effect inside the computer case by means of ventilation or exhaust. Of all the components that generate heat, the central processing unit (CPU) is generally the most problematic as it typically has the highest workload. Nowadays, the graphics of various computer games are becoming more and more sophisticated, and the functions of computer-assisted graphic software are also becoming more and more powerful. Such software often puts the CPU and the graphic chip processor in a highly loaded state in operation, and at the same time causes a large amount of heat to be generated. If the heat is not dispersed efficiently, it at least can lead to a decrease in the performance of the CPU or the graphic chip processor, and at worst, it may even cause damage to the CPU or the graphic chip processor, or drastically reduce the life span of the CPU or the graphic chip processor.

FIG. 7 illustrates a prior art heat dissipation device. As shown in FIG. 7, in order to reduce the working temperature of the heat-generating electronic components, the liquid-cooling device generally comprises a water-cooled block (c) contacting a heat-generating element (d) (such as a central processing unit), and a radiator (a) connected to the water-cooled block (c) through two water conduits (b), whereby the working fluid (usually water) with a certain pressure passes through the water-cooled block (c) to take away the heat from the heat-generating element (d), and flows to the radiator (a) to dissipate the heat and to continuously carry out the circulation of the cooling liquid, so as to quickly dissipate the heat. However, once the above-mentioned liquid-cooling device is installed, most of the volume of these two conduits is exposed on the motherboard, which not only affects the layout of other devices, but also makes the wiring inside the computer chassis messy, resulting in an unattractive visual experience.

SUMMARY OF THE DISCLOSURE

The main purpose of the present disclosure is to provide a liquid-cooling heat dissipation device that is simple in structure, low in cost and can reduce the impact of liquid-flow conduits on the internal layout and aesthetics of the computer chassis.

In one aspect, the present disclosure relates to a liquid-cooling heat dissipation device comprising a cooling plate, a heat dissipator having a working liquid therein, and at least two conduits (e.g., a first conduit and a second conduit) connecting the cooling plate to the heat dissipator. In one embodiment, a surface of the cooling plate is configured to contact a corresponding surface of the heat-generating component such that heat generated by the heat-generating component is transferred to the cooling plate. In one embodiment, heat is conducted away from the heat dissipator by the working liquid. In one embodiment, the working liquid circulates within the at least two conduits to effect the heat transfer from the heat generating device to the cooling plate. The working liquid may be any suitable heat transfer liquid, such as water or any other high heat capacity fluid.

In one embodiment, the liquid-cooling heat dissipation device comprises a carriage device mounted on one or more sides of the heat dissipator. In one embodiment, the carriage device is configured to hold one or more of the at least two conduits. In one embodiment, the carriage device comprises an L-shaped bracket having an underplate and a lateral plate. In one embodiment, in the mounted configuration, wherein the carriage device is mounted to the heat dissipation device, a placement space is formed between the lateral plate and one or more sides of the heat dissipator. The placement space provides a void volume for retaining the at least two conduits.

In one embodiment, a fan device is attached to the heat dissipator (e.g., to the bottom portion of the heat dissipator), and the carriage device is mounted onto the fan device.

In one embodiment, a front end of the cooling plate comprises a liquid inlet and a liquid outlet. In one embodiment, the heat dissipator may connect to the liquid inlet of the cooling plate via a first conduit. In one embodiment, the heat dissipator may connect to the liquid outlet of the cooling plate via the second conduit. The connections between the at least two conduits, the cooling plate and the heat dissipator may define a circulation loop, wherein the working liquid may circulate between the heat dissipator and the cooling plate via the at least two conduits. Accordingly, continuous heat transfer may be realized.

In one embodiment, the heat dissipator includes one or more unions (e.g., elbow unions) for connecting to the first and second conduits. In one embodiment, a first end of a first conduit connects to a liquid inlet of the cooling plate and a second end of the first conduit connects to a union of the heat dissipator. In one embodiment, a first end of a second conduit connects to a liquid outlet of the cooling plate and a second end of the second conduit connects to a union of the heat dissipator.

In one embodiment, the liquid-cooling heat dissipation device comprises a shield. In one embodiment, the shield is configured to cover one or more unions of the heat dissipator. In one embodiment, a portion of the shield (e.g., a bottom portion) comprises a liquid-absorbing element (e.g., a water-absorbing element).

In one embodiment, the heat-generating component may be a central processing unit (CPU). In another embodiment, the heat-generating component may be a graphical chip processor.

For further understanding the characteristics and effects of the present invention, some preferred embodiments referring to drawings are described in detail as follows.

DETAILED DESCRIPTION

FIGS. 1-6 show one or more non-limiting embodiments of a liquid-cooling heat dissipation device. In the illustrated embodiment(s), the liquid-cooling heat dissipation device comprises a cooling plate 1, a heat dissipator 2, two conduits 3 connecting the cooling plate 1 to the heat dissipator 2, and at least one carriage device 4.

Figure 5:
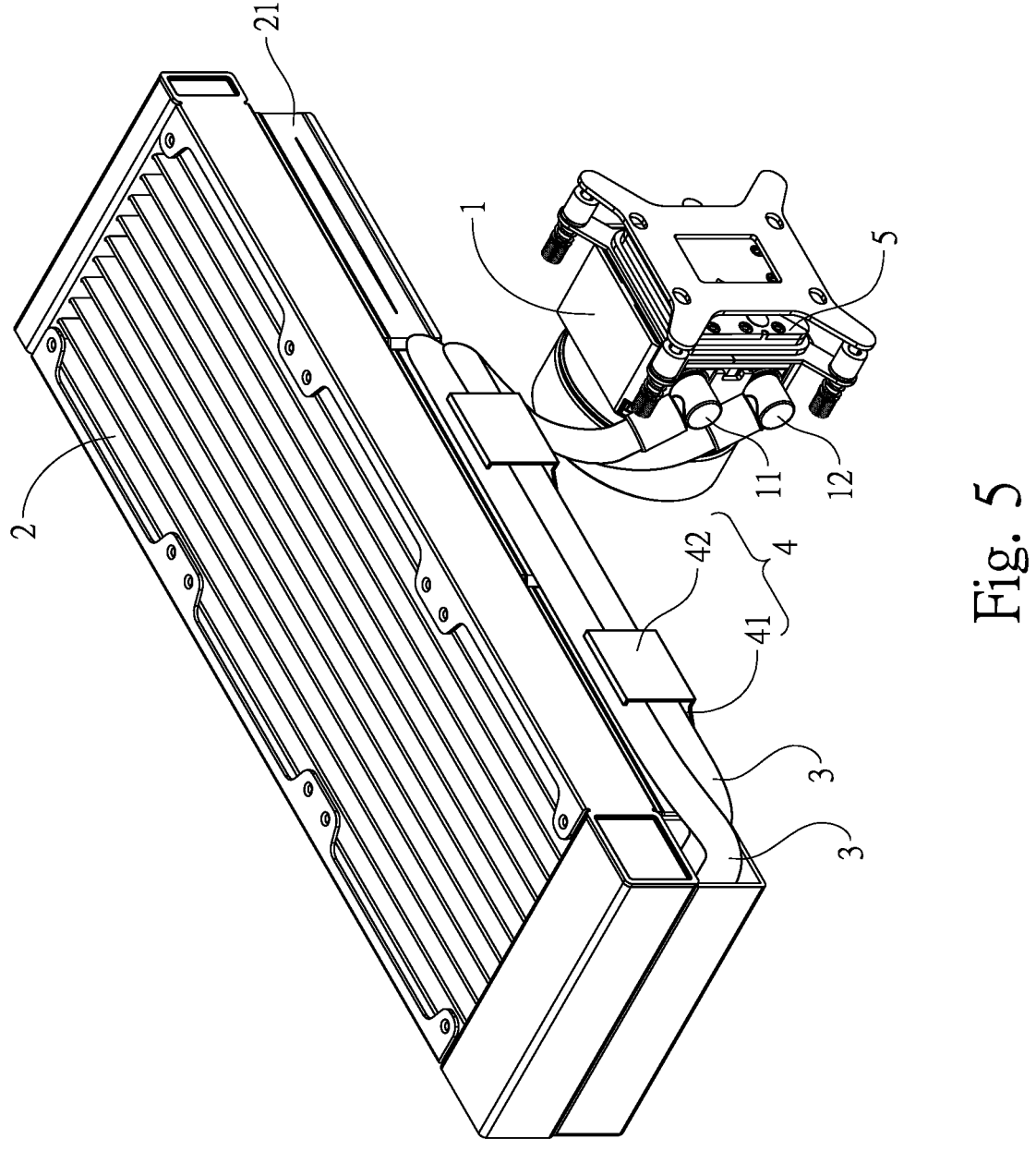
FIG. 5 is a schematic perspective view of an embodiment of the present disclosure after the conduits are held by the carriage device.
Figure 6:
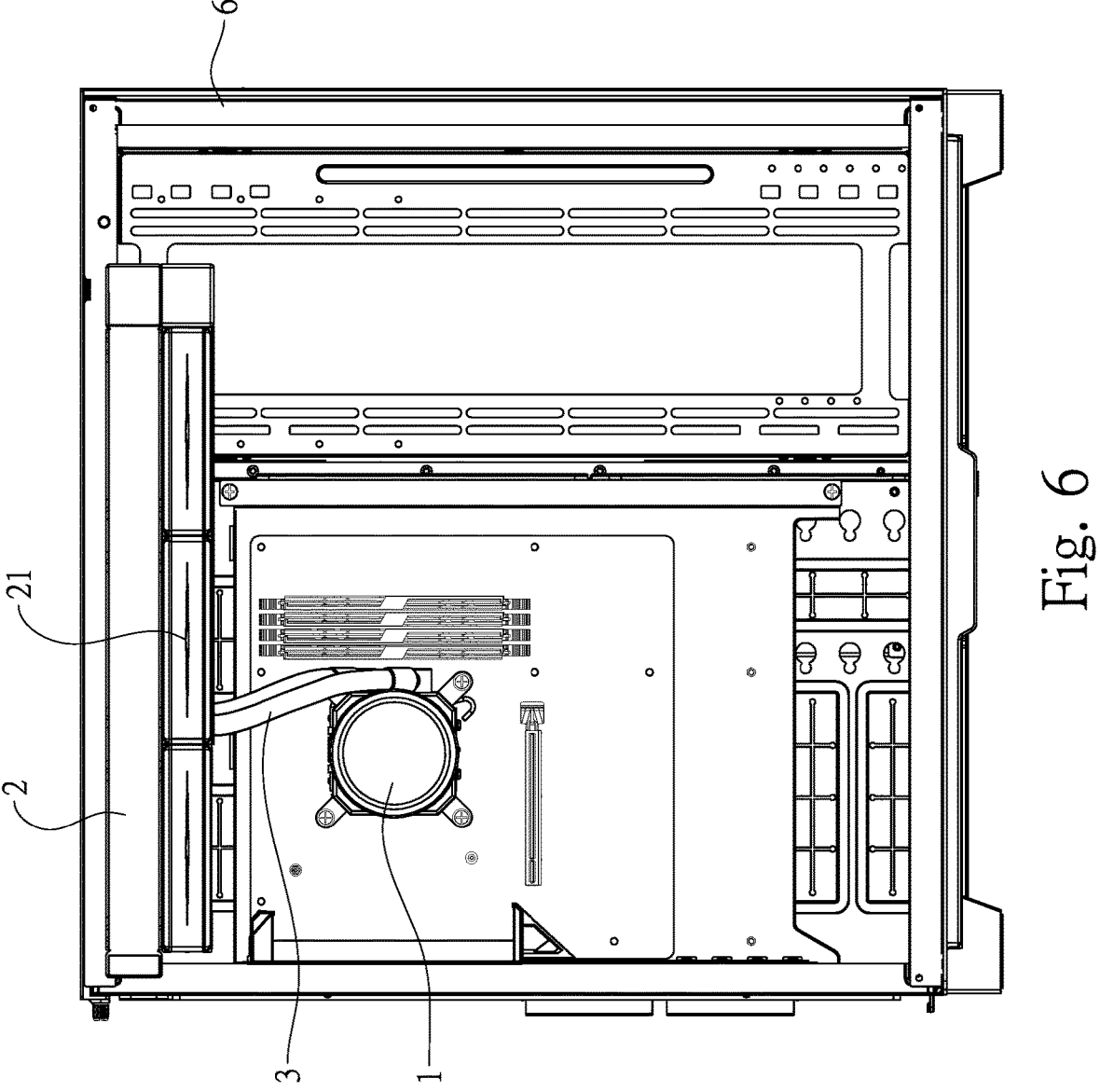
FIG. 6 is a schematic perspective view of an embodiment of the present disclosure after the liquid-cooling heat dissipation device is installed in the computer chassis.
Figure 7:
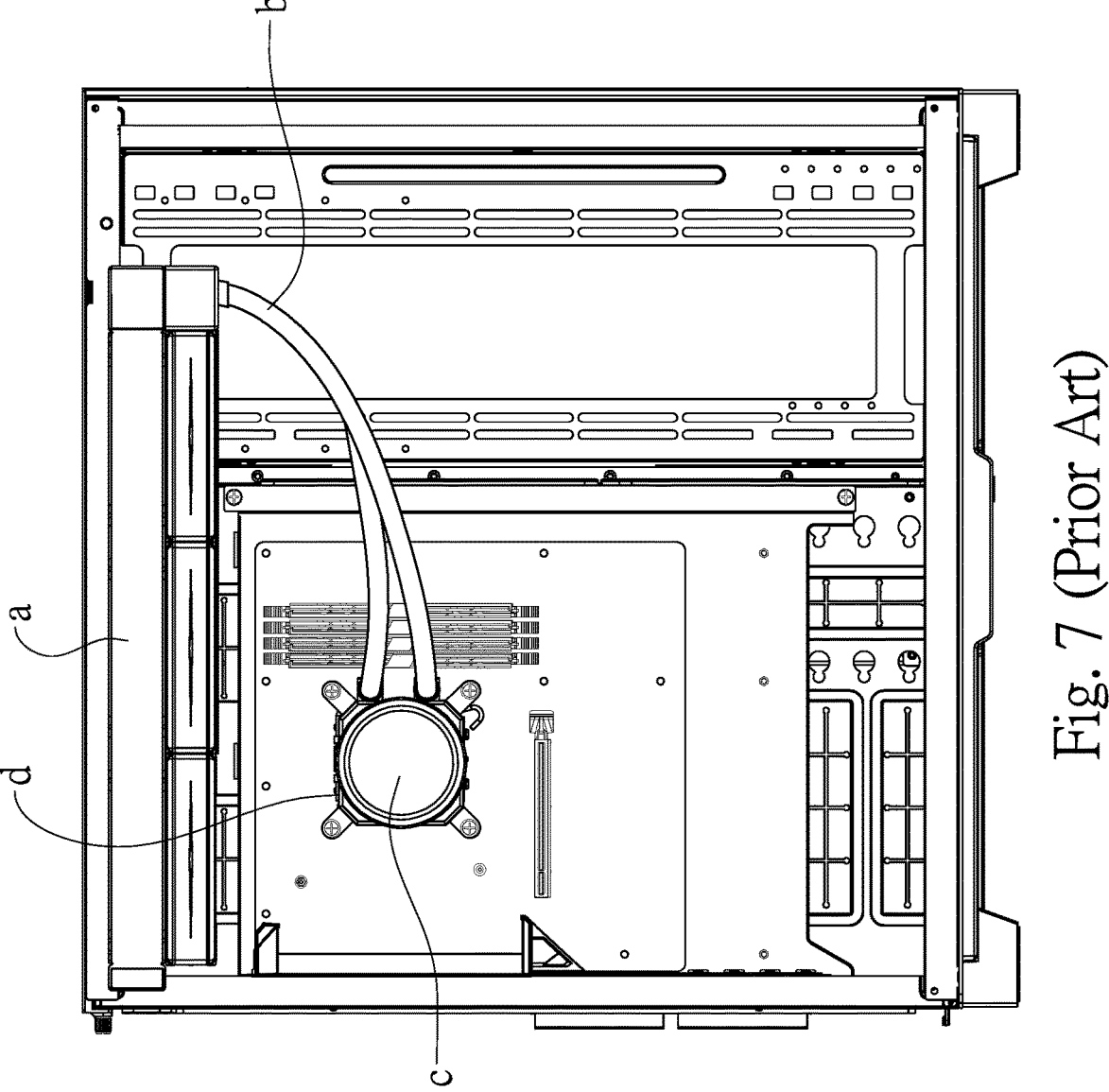
FIG. 7 is a schematic perspective view of a prior art (conventional) liquid-cooling device.

In the illustrated embodiment(s), a front end of the cooling plate 1 is disposed with a liquid inlet 11 and a liquid outlet 12. In one embodiment, the heat dissipator 2 may separately connect to the liquid inlet 11 of the cooling plate 1 via the first one of the two conduits 3 and may also connect to the liquid outlet 12 of the cooling plate 1 via the second one of the two conduits 3, thereby facilitating the working liquid to circulate between the heat dissipator 2 and the cooling plate 1 via the two conduits 3. A surface of the cooling plate 1 may be configured to contact a heat-generating component 5 (as shown in FIG. 5) to facilitate removal of heat therefrom. In one embodiment, the heat-generating component 5 may be a central processing unit (CPU). In another embodiment, the heat-generating component may be a graphic chip processor.

In one embodiment, one side of the heat dissipator 2 may include at least one carriage device 4 mounted thereon. In the illustrated embodiment(s), two carriage devices 4 are illustrated, the carriage devices being in the form of an L-shaped bracket having an underplate 41 and a lateral plate 42. One or more holes may be included in the carriage device 4 for mounting to the heat dissipator 2 (e.g., via a fastener, such as a screw). In the mounted configuration, a placement space 43 is formed between the lateral plate 42 and one side of the heat dissipator 2. The placement space may be configured to hold one or more of the two conduits 3. In one embodiment, a bottom portion of the heat dissipator 2 is connected to a fan device 21, and at least a portion of the underplate 41 of the carriage device 4 is secured onto the fan device 21. Although the carriage device 4 is illustrated as being in the form of an L-shaped bracket, any suitable carriage device may be used to hold the two conduits 3 in place, including brackets of other shapes, double-sided tapes, and/or other fasteners (e.g., ropes).

Figure 1:
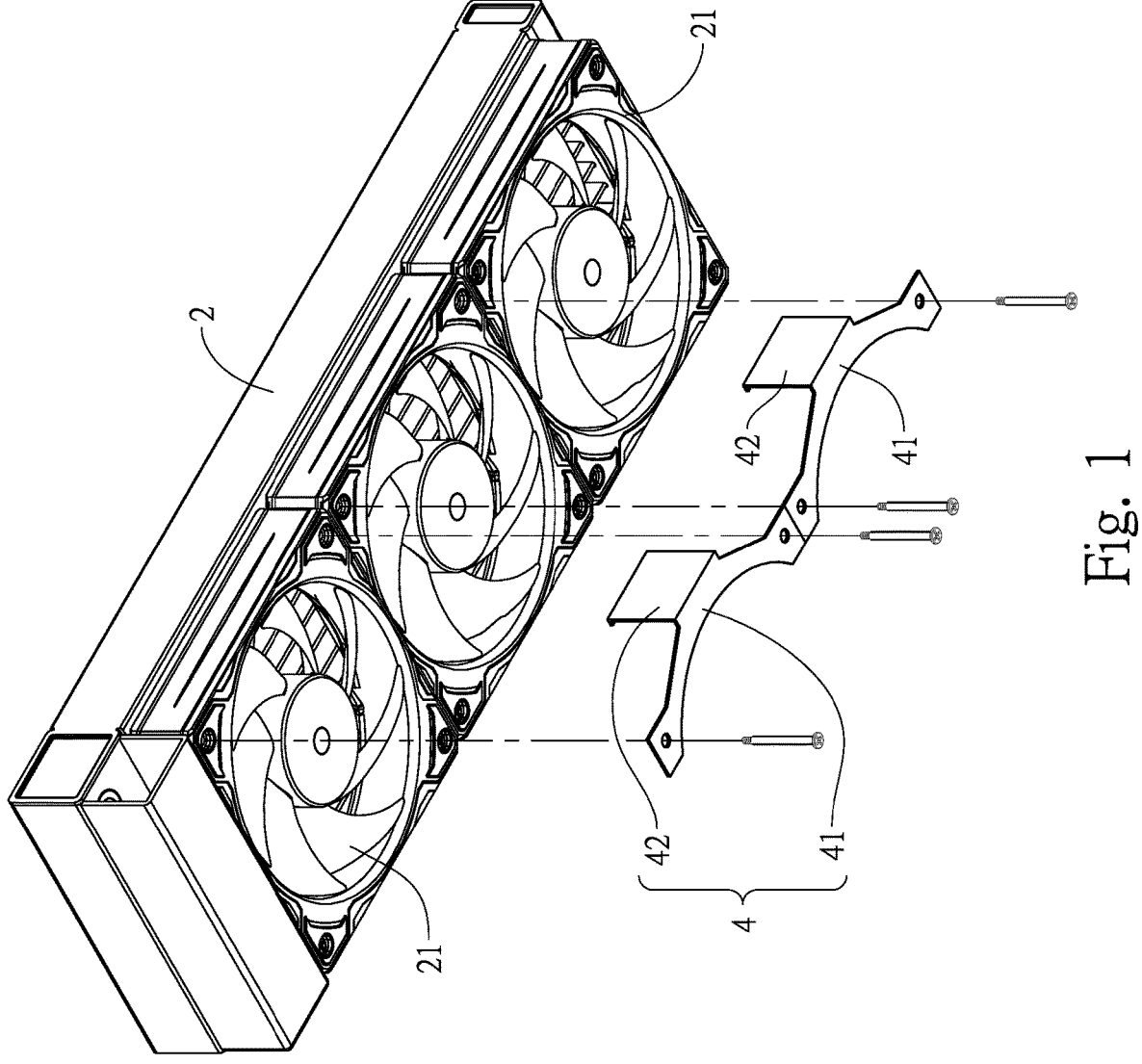
FIG. 1 is a schematic perspective view of an embodiment of the present disclosure before the carriage device is mounted onto the heat dissipator.
Figure 2:
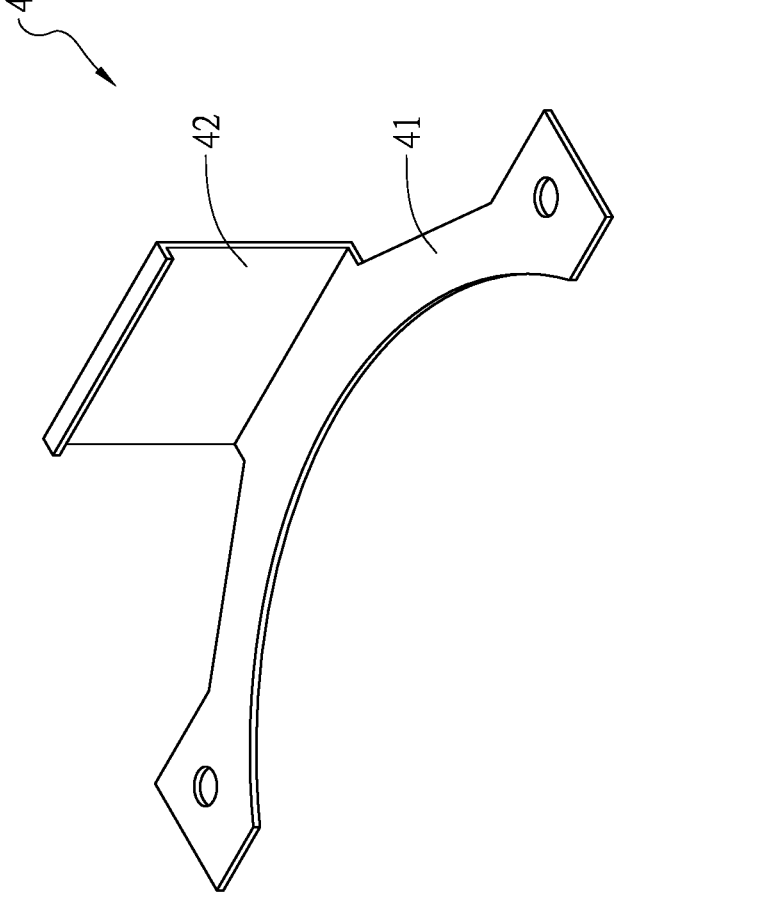
FIG. 2 is a schematic perspective view of the carriage device of an embodiment of the present disclosure.
Figure 3:
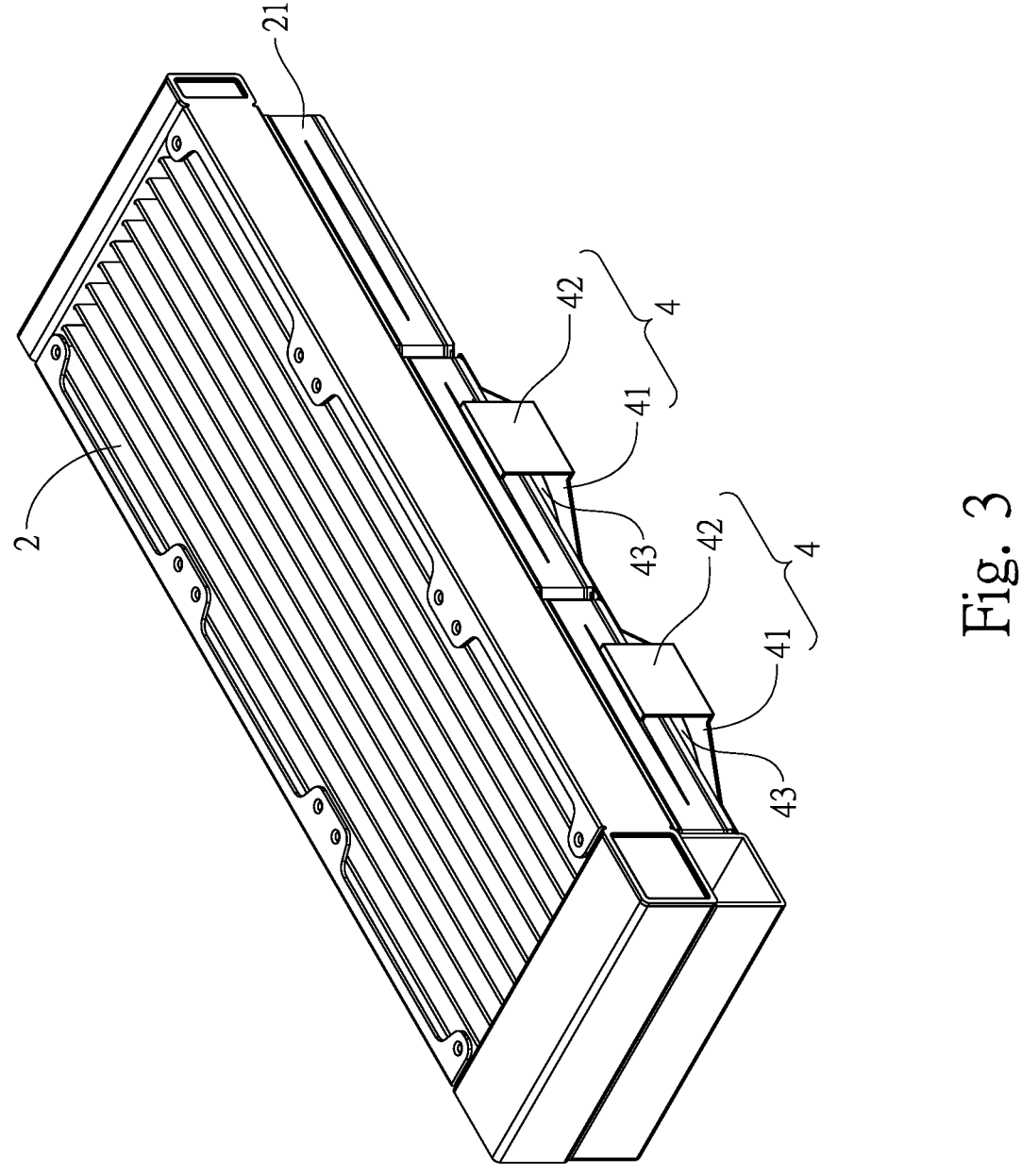
FIG. 3 is a schematic perspective view of an embodiment of the present disclosure after the carriage device is mounted onto the heat dissipator.
Figure 4:
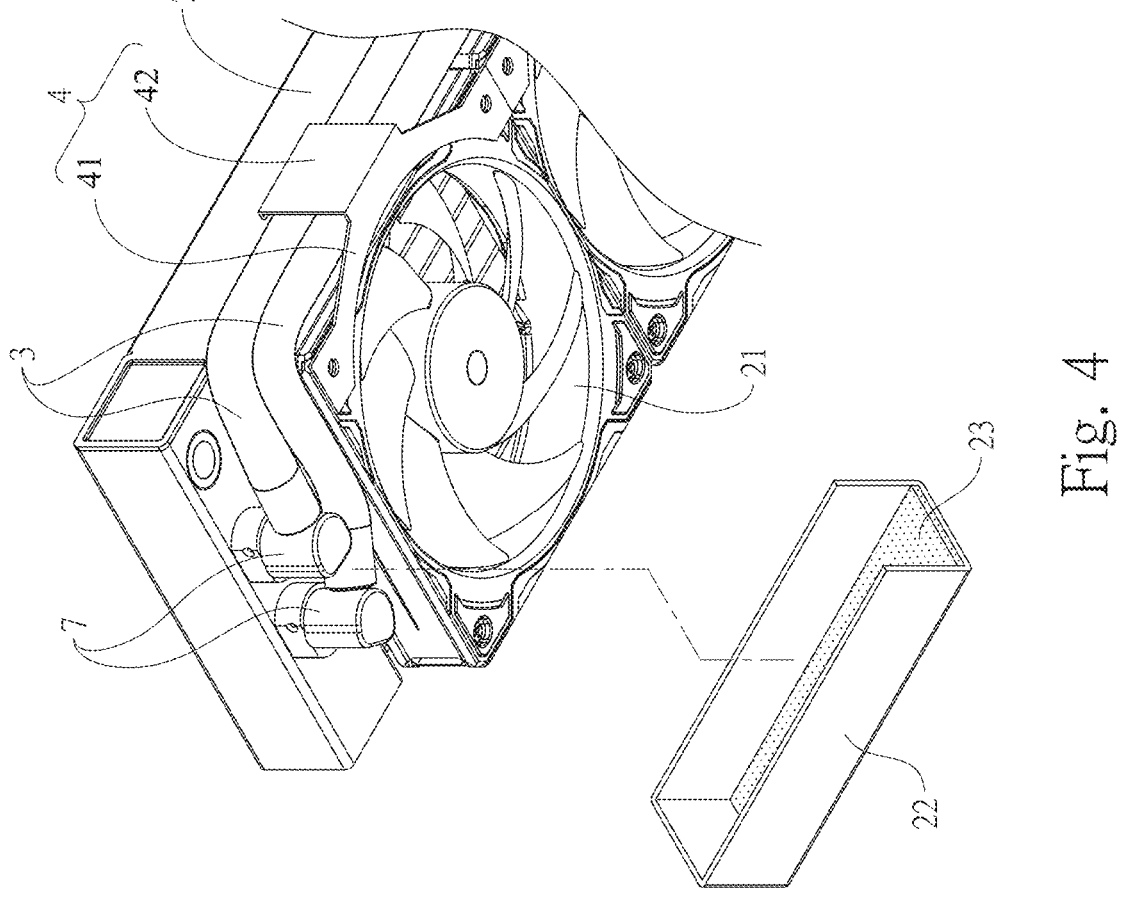
FIG. 4 is a schematic perspective view of an embodiment of the present disclosure after the elbow unions are assembled.

In one embodiment, and referring now to FIG. 4, the heat dissipator 2 may be connected to one or more of the two conduits 3 via one or more elbow unions 7. In one embodiment, due to the elbow unions 7, bending of the two conduits 3 may be lessened. Moreover, a smaller form factor is achieved. In one embodiment, a shield 22 is provided to cover the one or more elbow unions 7 of the heat dissipator 2. The elbow union(s) 7 may be of any suitable configuration and may include ninety-degree unions, as illustrated, or other angled unions, such as forty-five degree unions, one-hundred-thirty-five degree unions, among others. Any suitable angled union may be used.

In one embodiment, the shield 22 comprises an open first end and a closed opposite end. In one embodiment, the two conduits 3 exit the shield via the open first end. In one embodiment, a bottom portion of the shield 22 is disposed with a liquid-absorbing element 23.

Referring back to FIGS. 1-6, due to the disclosed arrangement, when the liquid-cooling heat dissipation device of the present disclosure is used in a computer chassis 6, the two conduits 3, are held in the placement space 43 between the lateral plate 42 of the carriage device(s) 4 and the heat dissipator 2. When the computer is in operation, the heat generated by the heat-generating component 5 may enter the cooling plate 1 and be carried away by the working liquid via the first one of the two conduits 3 to the heat dissipator 2 to cool down the working liquid. In turn, the working liquid cooled down in the heat dissipator 2 may pass through the cooling plate 1 via the second one of the two conduits 3 to carry away the heat from the cooling plate 1 again.

Thus, the present disclosure realizes at least the following advantages:

1. No matter where the heat dissipator is installed, the at least two conduits 3 can be held in place by the carriage device so that the interior of the computer chassis is ordered and not cluttered, and the user will not be obstructed by the conduits when adding or dismantling other devices.

2. The one or more unions of the heat dissipator make it more convenient to connect the at least two conduits and may lessen bending of the conduits. In turn, improved aesthetics may be achieved and the working liquid may flow more smoothly.

3. The shield used to cover the one or more unions of the heat dissipator protect the unions from damage and may prevent inadvertent detachment of the conduits from the unions. Also, the liquid-absorbing element of the shield may effectively reduce the risk of leakage of the working liquid from the heat dissipator.

As disclosed in the above description and attached drawings, the present disclosure provide a liquid-cooling heat dissipation device. It is new and can be put into industrial use.

Although the embodiments of the present disclosure have been described in detail, many modifications and variations may be made by those skilled in the art from the teachings disclosed herein. Therefore, it should be understood that any modification and variation equivalent to the spirit of the present disclosure should be regarded as falling within the scope defined by the appended claims.

What is claimed is:

1. A liquid-cooling heat dissipation device, including:
a cooling plate;
a heat dissipator having a working liquid therein, wherein a bottom portion of the heat dissipator comprises a fan device;
and wherein a surface of the cooling plate is configured to contact a heat-generating component; and a first conduit connected to the cooling plate and the heat dissipator; a second conduit connected to the cooling plate and the heat dissipator; wherein the first and second conduits are configured to transport the working liquid; and a carriage device mounted on the fan device, wherein the carriage device is a L-shaped bracket having an underplate and a lateral plate, and a placement space is formed between the underplate, the lateral plate, and a side of the fan device for holding the first and second conduits in the placement space.

2. The liquid-cooling heat dissipation device according to claim 1, wherein the heat dissipator is connected to at least the first conduit by an elbow union.

3. The liquid-cooling heat dissipation device according to claim 1, wherein a portion of the cooling plate comprises a liquid inlet and a liquid outlet; wherein the first conduit connects the heat dissipator to the liquid inlet, and the wherein second conduit connects the liquid outlet to the heat dissipater, thereby forming a circulation loop, so as to allow the working liquid to circulate between the heat dissipator and the cooling plate.

4. The liquid-cooling heat dissipation device according to claim 3, wherein the heat dissipator is connected to the first conduit by a first elbow union.

5. The liquid-cooling heat dissipation device according to claim 4, wherein the heat dissipater is connected to the second conduit by a second elbow union.

6. The liquid-cooling heat dissipation device according to claim 4, wherein a shield covers the first elbow union, and a bottom portion of the shield comprises a water-absorbing element.

7. The liquid-cooling heat dissipation device according to claim 1, wherein the heat-generating component comprises a central processing unit (CPU) or a graphic chip processor.

* * * * *